United States Patent
Shin et al.

(10) Patent No.: US 12,014,772 B2
(45) Date of Patent: Jun. 18, 2024

(54) STORAGE CONTROLLER AND STORAGE DEVICE INCLUDING THE SAME

(71) Applicant: SAMSUNG ELECTRONICS CO., LTD., Suwon-si (KR)

(72) Inventors: Dong Eun Shin, Seoul (KR); Jeong Uk Kang, Seongnam-si (KR); Hyun Jin Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 115 days.

(21) Appl. No.: 17/847,948

(22) Filed: Jun. 23, 2022

(65) Prior Publication Data
US 2023/0154529 A1    May 18, 2023

(30) Foreign Application Priority Data

Nov. 17, 2021 (KR) .................. 10-2021-0158688
Jan. 19, 2022 (KR) .................. 10-2022-0007670

(51) Int. Cl.
*G11C 11/56* (2006.01)
*G11C 16/04* (2006.01)
*G11C 16/08* (2006.01)
*G11C 16/10* (2006.01)

(52) U.S. Cl.
CPC ...... *G11C 11/5628* (2013.01); *G11C 11/5671* (2013.01); *G11C 16/0483* (2013.01); *G11C 16/08* (2013.01); *G11C 16/10* (2013.01)

(58) Field of Classification Search
CPC ...................................................... G11C 11/56
USPC ........................................... 365/185.03
See application file for complete search history.

(56) References Cited

U.S. PATENT DOCUMENTS

| | | | |
|---|---|---|---|
| 7,734,880 B2 | 6/2010 | Kang et al. |
| 8,913,428 B2 | 12/2014 | Li |
| 9,007,827 B2 | 4/2015 | Jung et al. |
| 9,026,757 B2 | 5/2015 | Li |
| 9,378,137 B2 | 6/2016 | Kim et al. |
| 9,778,862 B2 | 10/2017 | Yeh |

(Continued)

FOREIGN PATENT DOCUMENTS

| CN | 103226975 B | 5/2018 |
|---|---|---|
| JP | 2005-302290 A | 10/2005 |

(Continued)

OTHER PUBLICATIONS

Communication dated Mar. 31, 2023, issued by the Korean Intellectual Property Office in Korean Patent Application No. 10-2022-0007670.

(Continued)

*Primary Examiner* — Hoai V Ho
(74) *Attorney, Agent, or Firm* — Sughrue Mion, PLLC

(57) ABSTRACT

A storage controller for writing first data to a first memory cell by performing programming of the first memory cell N-times, where N is a positive integer greater than 1, includes a write amplification manager and a central processing unit. The write amplification manager checks whether the first data is invalid data before an $N^{th}$ programming of the first memory cell is performed, and the central processing unit does not perform the N-th programming of the first memory cell when the first data is the invalid data.

20 Claims, 19 Drawing Sheets

(56) References Cited

U.S. PATENT DOCUMENTS

| | | |
|---|---|---|
| 10,803,951 B2 | 10/2020 | Lee |
| 2014/0245105 A1* | 8/2014 | Chung .................. G06F 3/0604 |
| | | 714/763 |
| 2021/0090657 A1 | 3/2021 | Ahn |
| 2021/0223962 A1 | 7/2021 | Esaka et al. |

FOREIGN PATENT DOCUMENTS

| | | |
|---|---|---|
| JP | 2014-506688 A | 3/2014 |
| KR | 10-2008-0066959 A | 7/2008 |
| KR | 10-0903694 B1 | 6/2009 |
| KR | 10-2015-0129941 A | 11/2015 |
| KR | 10-2016-0084370 A | 7/2016 |
| KR | 10-2016-0139864 A | 12/2016 |
| KR | 10-2017-0097543 A | 8/2017 |
| KR | 10-2020-0018999 A | 2/2020 |
| KR | 10-2021-0038096 A | 4/2021 |

OTHER PUBLICATIONS

Communication dated Apr. 19, 2023 by the European Patent Office in counterpart European Patent Application No. 22192775.9.
Communication dated May 3, 2023 by the European Patent Office in counterpart European Patent Application No. 22192775.9.
Communication dated Dec. 20, 2022, issued by the Korean Intellectual Property Office in Korean Patent Application No. 10-2022-0007670.

* cited by examiner

STORAGE CONTROLLER AND STORAGE DEVICE INCLUDING THE SAME

CROSS-REFERENCE TO RELATED APPLICATIONS

This application claims priority from Korean Patent Application No. 10-2021-0158688 filed on Nov. 17, 2021 in the Korean Intellectual Property Office and Korean Patent Application No. 10-2022-0007670 filed on Jan. 19, 2022 in the Korean Intellectual Property Office, the contents of each of which are herein incorporated by reference in their entireties.

BACKGROUND

The present disclosure relates to a storage controller and a storage device including the same.

Storage devices including a NAND flash memory may be utilized in various modern systems from subminiature electronic devices to media servers. In a storage device including the NAND flash, write amplification (WAF), which is caused by garbage collection, may cause irregular performance of the storage device.

In various situations, the storage device may perform a flush operation on a data in response to a command from a host that the data is no longer used.

Both the irregular performance caused by the WAF and a speed of the flush operation contribute to the performance of the storage device, and thus, there is a need to improve WAF characteristics and increase a speed of the flush operation.

SUMMARY

It is an aspect to provide a storage controller with improved write amplification (WAF) characteristics and increased flush operation speed.

It is another aspect to provide a storage device including a storage controller with improved WAF characteristics and increased flush operation speed.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of one or more embodiments, there is provided a storage controller for writing first data to a first memory cell by performing programming of the first memory cell N-times (N being a positive integer greater than 1), the storage controller comprising a write amplification (WAF) manager configured to check whether the first data is invalid data before an Nth programming of the first memory cell is performed; and a central processing unit (CPU) configured not to perform the N-th programming of the first memory cell when the first data is the invalid data.

According to an aspect of one or more embodiments, there is provided a storage device for writing first data to a first memory cell by performing programming of the first memory cell N-times (N being a positive integer greater than 1), the storage device comprising a non-volatile memory (NVM) device comprising the first memory cell; and a storage controller configured to write the first data to the first memory cell. The storage controller comprises a write amplification (WAF) manager configured to check whether the first data is invalid data before an Nth programming of the first memory cell is performed; and a central processing unit (CPU) configured not to perform the N-th programming of the first memory cell when the first data is the invalid data.

According to an aspect of one or more embodiments, there is provided a storage device for writing first data to a first memory block and writing second data to a second memory block by performing programming of each of the first memory block and the second memory block N-times (N being a positive integer greater than 1), the storage device comprising a non-volatile memory (NVM) device comprising the first memory block and the second memory block; and a storage controller configured to write the first data to the first memory block and write the second data to the second memory block. The storage controller comprises a write amplification (WAF) manager comprising an open memory cell detector configured to check whether an open memory cell exists in the first memory block or the second memory block before an Nth programming of the first memory block and the second memory block is performed, and a memory cell compactor configured to conduct memory cell compaction by moving a location of an (N−1)th-programming of a memory cell in one memory block of the first memory block and the second memory block to a memory cell the other memory block of the first memory block and the second memory block when the open memory cell exists in the first memory block or the second memory block; and a central processing unit (CPU) configured to not perform the Nth programming of the first memory block and the second memory block after the memory cell compactor conducts the memory cell compaction.

BRIEF DESCRIPTION OF THE DRAWINGS

The above and other aspects will become more apparent by describing in detail exemplary embodiments thereof with reference to the attached drawings, in which.

DETAILED DESCRIPTION

A host communicating with a storage device may transmit a Trim command to the storage device to inform the storage device that data present in a specific area of the storage device is no longer used. The storage device which has received the Trim command may perform flush operation on the corresponding data.

As described above, both the irregular performance caused by the WAF and the speed of the flush operation contribute to the performance of the storage device. Various embodiments provide a storage system and storage device with improved WAF characteristics and increased speed of the flush operation.

Hereinafter, various embodiments will be described with reference to the attached drawings.

Figure 1:
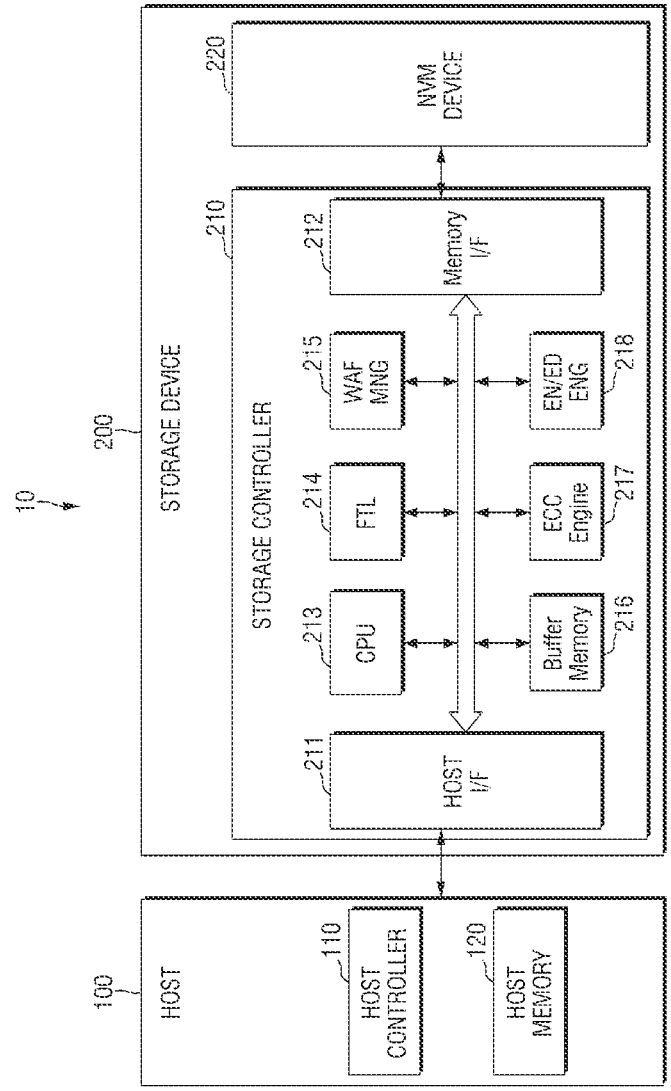
FIG. 1 is a block diagram illustrating a storage system according to some embodiments.

FIG. 1 is a block diagram illustrating a storage system according to some embodiments.

Referring to FIG. 1, a storage system 10 may include a host 100 and a storage device 200. In addition, the storage device 200 may include a storage controller 210 and a non-volatile memory (NVM) device 220. Also, according to an exemplary embodiment, the host 100 may include a host controller 110 and a host memory 120. The host memory 120 may serve as a buffer memory configured to temporarily store data to be transferred to the storage device 200 or data received from the storage device 200.

The storage device 200 may include storage media configured to store data in response to requests from the host 100. For example, the storage device 200 may include a solid state drive (SSD). For example, when the storage device 200 is implemented as an SSD, the storage device 200 may be a device that conforms to the non-volatile memory express (NVMe) standard. Each of the host 100 and the storage device 200 may generate a packet according to an adopted standard protocol and transfer the packet.

When the NVM device 220 of the storage device 200 includes a flash memory, the flash memory may include a 2D NAND memory array or a 3D (or vertical) NAND (VNAND) memory array.

According to some embodiments, the host controller 110 and the host memory 130 may be embodied as separate semiconductor chips. Alternatively, in other embodiments, the host controller 110 and the host memory 130 may be integrated in the same semiconductor chip. As an example, in some embodiments, the host controller 110 may be any one of a plurality of modules included in an application processor (AP). The AP may be embodied as a System on Chip (SoC). Further, the host memory 130 may be an embedded memory included in the AP or an NVM or memory module located outside the AP.

The host controller 110 may manage an operation of storing data (e.g., write data) of a buffer region of the host memory 120 in the NVM device 220 (i.e., data from the host memory 120 may be written to the NVM device 220), or an operation of storing data (e.g., read data) of the NVM device 220 in the buffer region of the host memory 120 (i.e., data may be read from the NVM device 220 and stored in the buffer region of the host memory 120).

The storage controller 210 may include a host interface (I/F) 211, a memory interface (I/F) 212, and a central processing unit (CPU) 213. In addition, the storage controller 210 may further include a flash translation layer (FTL) 214, a write amplification (WAF) manager (MNG) 215, a buffer memory 216, an error correction code (ECC) engine 217, and an encryption/decryption (EN/ED) engine (ENG) 218. The storage controller 210 may further include a working memory (not shown) in which the FTL 214 is loaded. The CPU 213 may execute the FTL 214 to control data write and read operations on the NVM device 220.

The host interface 211 may transfer and receive packets to and from the host 100. A packet transferred from the host 100 to the host interface 211 may include a command or data to be written to the NVM device 220. A packet transferred from the host interface 211 to the host 100 may include a response to the command or data read from the NVM device 220.

The command transferred from the host 100 to the host interface 211 may be, for example, a write command, a read command, a Trim command, or the like.

The memory interface 212 may transfer data to be written to the NVM device 220 to the NVM device 220 or receive data read from the NVM device 220. The memory interface 212 may be configured to comply with a standard protocol, such as, for example, Toggle or open NAND flash interface (ONFI).

The FTL 214 may perform various functions, such as, for example, an address mapping operation, a wear-leveling operation, and a garbage collection operation. The address mapping operation may be an operation of converting a logical address received from the host 100 into a physical address used to actually store data in the NVM device 220.

For example, the FTL 214 may store a mapping table in which a first logical address of first data and first physical address mapped to the first logical address are recorded. That is, the FTL 214 may perform an address mapping operation for the first data by referring to the mapping table.

The wear-leveling operation may be a technique for preventing excessive deterioration of a specific block by ensuring that blocks of the NVM device 220 are uniformly used. As an example, the wear-leveling operation may be embodied using a firmware technique that balances erase counts of physical blocks. The garbage collection operation may be a technique for ensuring usable capacity in the NVM device 220 by erasing an existing block after copying valid data of the existing block to a new block.

The ECC engine 217 may perform error detection and correction operations on read data read from the NVM device 220. More specifically, the ECC engine 217 may generate parity bits for write data to be written to the NVM device 220, and the generated parity bits may be stored in the NVM device 220 together with write data. During the reading of data from the NVM device 220, the ECC engine 217 may correct an error in the read data by using the parity bits read from the NVM device 220 along with the read data, and output error-corrected read data.

The encryption/decryption (EN/ED) engine (ENG) 218 may perform at least one of an encryption operation and a decryption operation on data input to the storage controller 210.

For example, the encryption/decryption engine 218 may perform an encryption operation and/or a decryption operation by using a symmetric-key algorithm. In this case, the encryption/decryption engine 218 may perform an encryption operation and/or a decryption operation by using, for example, an advanced encryption standard (AES) algorithm or a data encryption standard (DES) algorithm.

In addition, for example, the encryption/decryption engine 218 may perform an encryption operation and/or a decryption operation by using a public key encryption algorithm. For example, the encryption/decryption engine 218 may perform the encryption operation by using a public key and perform the decryption operation by using a secret key. For example, in some embodiments, the encryption/decryption engine 218 may use a Rivest Shamir Adleman (RSA) algorithm, an elliptic curve cryptography (ECC) algorithm, or a Diffie-Hellman (DH) algorithm.

In other embodiments, the encryption/decryption engine 218 may perform an encryption operation and/or a decryption operation using quantum cryptography technology, such as homomorphic encryption (HE), post-quantum cryptography (PQC), or functional encryption (FE), without being limited to the above examples.

The WAF manager (MNG) 215 may help to improve the performance of the storage device according to some embodiments when a memory cell included in the NVM device 220 is programmed. For example, the WAF manager 215 may improve WAF characteristics of the storage device according to some embodiments. Also, for example, the WAF manager 215 may increase a speed of a flush operation of the storage device according to some embodiments.

In this regard, a structure of the NVM device 220 will be first described with reference to FIG. 2.

Figure 2:
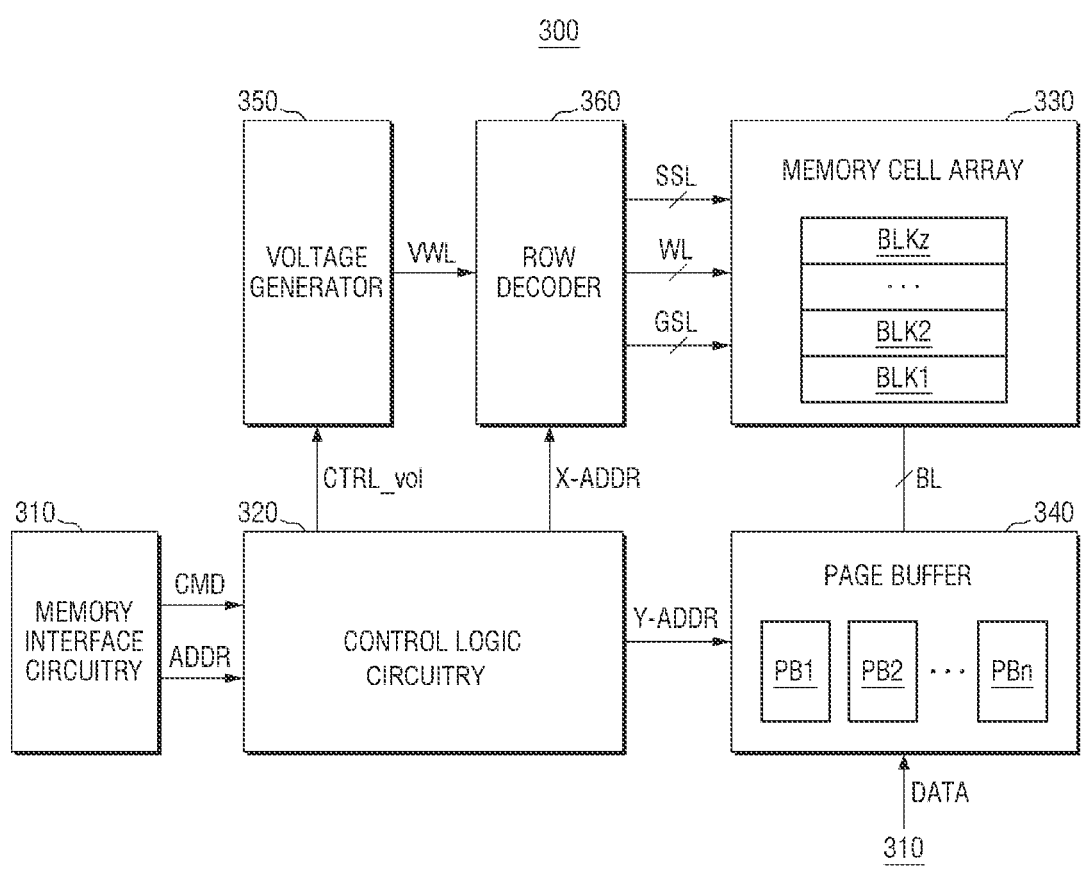
FIG. 2 is a block diagram illustrating an example of a non-volatile memory device of a storage device of the storage system of FIG. 1.

FIG. 2 is a block diagram illustrating an example of an non-volatile memory device of the storage device of the storage system of FIG. 1.

Referring to FIG. 2, a NVM device 300 may correspond to the NVM device 220 of the storage device 200 of FIG. 1.

Referring to FIG. 2, the NVM device 300 may include a control logic circuitry 320, a memory cell array 330, a page buffer 340, a voltage generator 3500, and a row decoder 360. The NVM device 300 may further include a memory interface circuitry 310 for communicating with the memory interface (I/F) 212 of the storage controller 210 shown in FIG. 1. In addition, in some embodiments, the NVM device 300 may further include a column logic, a pre-decoder, a temperature sensor, a command decoder, an address decoder, and the like.

The control logic circuitry 320 may control all various operations of the NVM device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. Examples of various non-volatile memory devices consistent with the present disclosure are provided in U.S. Pat. Nos. 7,679,133; 8,553,466; 8,654,587; and 8,559,235, and U.S. Pat. Pub. No. 2011/0233648 which are each hereby incorporated by reference in their entireties. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

The memory blocks included in the memory cell array 330 will be described with reference to FIG. 3.

Figure 3:
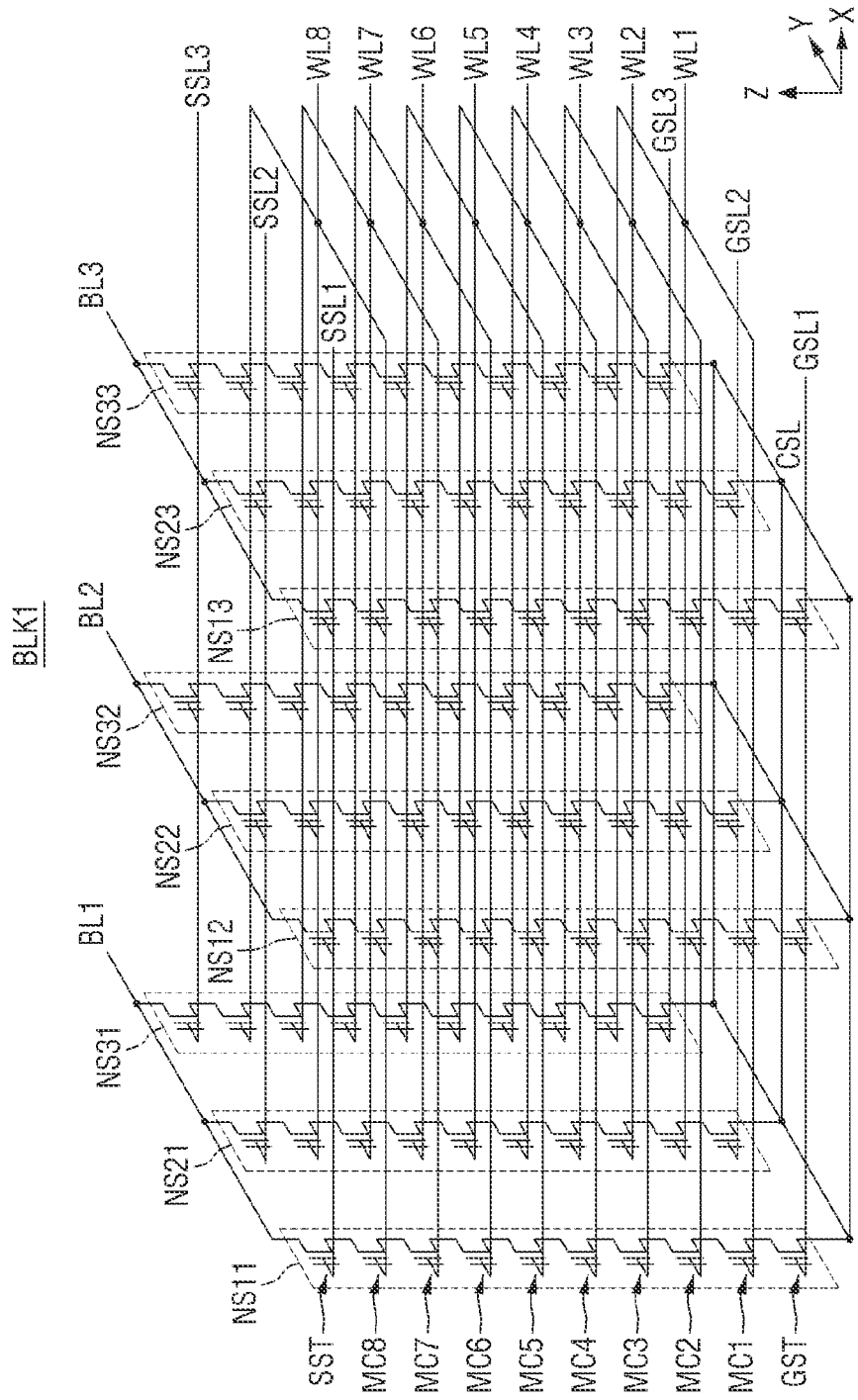
FIG. 3 is a circuit diagram for describing a memory block of the non-volatile member device of FIG. 2.

FIG. 3 is a circuit diagram for describing a memory block of the memory cell array illustrated in FIG. 2. Referring to FIGS. 2-3, the first memory block BLK1 of the memory cell array 330 is taken as an example. The description of the first memory block BLK 1 may also be applied to the other memory blocks BLK2 to BLKz and thus repeated description thereof is omitted for conciseness.

FIG. 3 illustrates a 3D V-NAND structure applicable to the memory blocks of the NVM devices 220 and 300 of FIGS. 1 and 2. When a NVM device is embodied as a 3D V-NAND flash memory, each of the plurality of memory blocks BLK1 to BLKz of FIG. 2 may be represented by an equivalent circuit shown in FIG. 3.

The first memory block BLK1 shown in FIG. 3 may refer to a 3D memory block having a 3D structure formed on a substrate. For example, a plurality of memory NAND strings NS11 to NS33 included in the first memory block BLK1 may be formed in a vertical direction to the substrate.

Referring to FIG. 3, the first memory block BLK1 may include a plurality of memory NAND strings NS11 to NS33, which are connected between bit lines BL1, BL2, and BL3 and a common source line CSL. Each of the memory NAND strings NS11 to NS33 may include a string selection transistor SST, a plurality of memory cells MC1, MC2, . . . , and MC8, and a ground selection transistor GST. Each of the memory NAND strings NS11 to NS33 is illustrated as including eight memory cells MC1, MC2, . . . , and MC8 in FIG. 53, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of word lines WL1, WL2, . . . , and WL8. Some of the word lines WL1, WL2, . . . , and WL8 may correspond to dummy word lines. The ground selection transistor GST may be connected to ground selection lines GSL1, GSL2, and GSL3 corresponding thereto. The string selection transistor SST may be connected to the bit lines BL1, BL2, and BL3 corresponding thereto, and the ground selection transistor GST may be connected to the common source line CSL.

Figure 5:
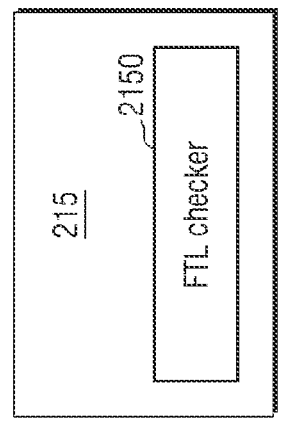
FIG. 5 is a block diagram illustrating a WAF manager according to some embodiments.

Word lines (e.g., WL1) at the same level may be connected in common, and the ground selection lines GSL1, GSL2, and GSL3 and the string selection lines SSL1, SSL2, and SSL3 may be separated from each other. FIG. 5 illustrates an example in which a memory block BLK1 is connected to eight word lines WL1, WL2, . . . , and WL8 and three bit lines BL1, BL2, and BL3, without being limited thereto.

Figure 4:
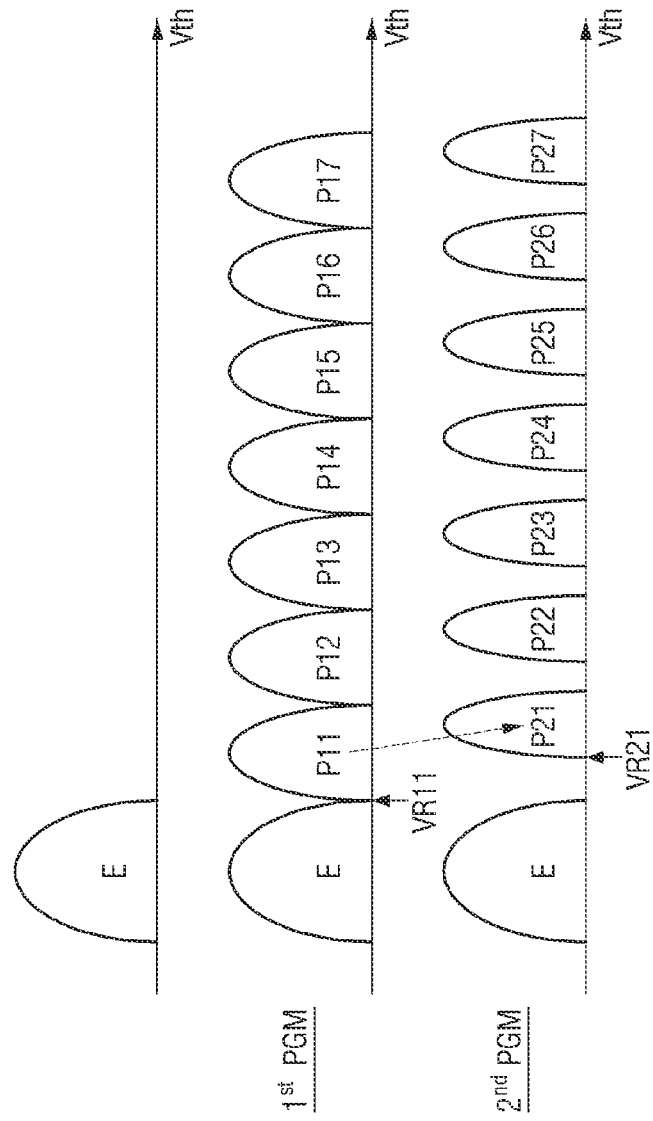
FIG. 4 is a diagram for describing an operation of a storage device according to some embodiments.

FIG. 4 is a diagram for describing an operation of a storage device according to some embodiments.

In the drawings, a description is given of an example in which 3-bit data is programmed, However, embodiments not limited thereto. It should be noted that, in some embodiments, 2-bit data and 1-bit data may be programmed.

Referring to FIGS. 1, 3, and 4, the storage controller 210 may write data to the NVM device 220. For example, the storage controller 210 may write first data to a first memory cell MC1 of the NVM device 220. In this case, the storage controller 210 may program the first memory cell MC1 N times (N is a positive integer greater than 1) to write the first data. That is, the storage controller 210 may perform multi-programming to write data to a memory cell of the NVM device 220.

In the following description, data is written by two times of programming, but the operation of the storage device 200 according to some embodiments is not limited thereto. For example, data may be written by N times, other than twice, of programming, where N is a positive integer.

As illustrated in FIG. 4, a first programming $1^{st}$ PGM may be performed such that each memory cell has a state corresponding to 3-bit data among eight states E, P11, P12, P13, P14, P15, P16, and P17. The eight states E and P11 to P17 may be adjacent to one another and have no read margins therebetween, as shown in FIG. 4. That is, in the first programming $1^{st}$ PGM, 3-bit data may be roughly programmed.

In an exemplary embodiment, the first programming $1^{st}$ PGM may be performed according to an incremental step pulse programming (ISPP) technique in which a program voltage is increased by a predetermined increment when a program loop is repeated.

In an exemplary embodiment, the first programming $1^{st}$ PGM may include a verification operation. The verification operation may be carried out on at least one program state. For example, in the first programming $1^{st}$ PGM, verification operations on the program states P12, P14, and P16 may be performed, while verification operations on the program states P11, P13, P15, and P17 may not be performed. That is, when the program states P12, P14, and P16 pass verification, the first programming $1^{st}$ PGM may be terminated.

A second programming $2^{nd}$ PGM may be perform to reprogram the first-programmed rough states P11 to P17 to denser states P21 to P27. Herein, the denser states P21 to P27, as shown in FIG. 4, may be adjacent to one another and have predetermined read margins therebetween. That is, 3-bit data programmed at the first programming $1^{st}$ PGM may be reprogrammed at the second programming $2^{nd}$ PGM. As described above, the 3-bit data used in the second programming $2^{nd}$ PGM is identical to the 3-bit data used in the first programming $1^{st}$ PGM. As shown in FIG. 4, the state P11 of the first-programmed memory cells may be reprogrammed to the denser state P21 in the second programming. As a result, a threshold voltage distribution corresponding to the denser state P21 of the second-programmed memory cells may be narrower in width than that corresponding to the first-programmed state P11 of the memory cells. In other words, a verification voltage VR21 for verifying the denser state P21 of the second-programmed memory cells may be higher than a verification voltage VR11 for verifying the state P11 of the first-programmed memory cells.

In an exemplary embodiment, the second programming $2^{nd}$ PGM may be carried out according to the ISPP technique.

In an exemplary embodiment, the second programming $2^{nd}$ PGM may include a verification operation. The verification operation may be carried out on all program states. When all the program states P21 to P27 pass verification, the second programming $2^{nd}$ PGM may be terminated, and the write of data may be completed.

In this case, before the second programming $2^{nd}$ PGM is executed on the first-programmed memory cell to complete the write of data, the WAF manager 215 may verify whether the data in the memory cell on which the second programming $2^{nd}$ PGM is to be performed is invalid data, and perform the second programming $2^{nd}$ PGM, without being limited thereto.

For example, in the case of the storage device 200 to which data is written by programming N times, before performing the $N^{th}$ programming of the $(N-1)^{th}$ programmed memory cell to complete the write of data, the WAF manager 215 may verify whether data in a memory cell on which the $N^{th}$ programming is to be performed is invalid data and perform the $N^{th}$ programming, without being limited thereto.

In addition, before performing the second programming $2^{nd}$ PGM of the first-programmed memory cell to complete the write of the data, the WAF manager 215 may first detect a memory block which includes an open memory cell, and when the memory block including the open memory cell is detected, may conduct compaction by moving the first-programmed memory cell to the memory block including the open memory cell, and perform the second programming $2^{nd}$ PGM, without being limited thereto.

For example, in the case of the storage device 200 to which data is written by N times of programming, before performing the $N^{th}$ programming of the $(N-1)^{th}$ programmed memory cell to complete the write of data, the WAF manager 215 may first detect a memory block which includes an open memory cell, and when the memory block including the open memory cell is detected, may conduct compaction by moving the $(N-1)^{th}$-programmed memory cell to the memory block including the open memory cell, and perform the $N^{th}$ programming.

The WAF characteristics of the storage device 200 according to some embodiments may be improved via the operation of the WAF manager 215 described above. In addition, the speed of the flush operation of the storage device 200 may be increased.

Hereinafter, the structure and operation of the WAF manager 215 will be described in detail. In the following description, data is written to a memory cell of the storage device 200 by two times of programming. However, it should be noted that, in some embodiments, data may be written to a memory cell of the storage device 200 by N-times of programming as discussed above.

FIG. 5 is a block diagram illustrating a WAF manager according to some embodiments.

Hereinafter, a description will be given of an example in which the storage controller 210 writes first data to the first memory cell MC1 by two times of programming. In addition, it is assumed that the first memory cell MC1 has already been programmed once and the final second programming has not been yet performed for writing the first data.

Referring to FIGS. 1, 3, and 5, the WAF manager 215 may include an FTL checker 2150. The FTL checker 2150 may communicate with the FTL 214 and check whether the first data is invalid data by referring to the mapping table in the FTL 214.

For example, when it is determined that the first physical address corresponding to the first logical address of the first data is not mapped according to the mapping table in the FTL 214, the FTL checker 2150 may determine that the first data is invalid data.

In another example, when it is determined that a Trim command (e.g., an example of a command CMD) is transferred from the host 100 for the first data according to the mapping table in the FTL 214, the FTL checker 2150 may determine that the first data is invalid data.

The storage controller 210, more specifically the CPU 213 of the storage controller 210, does not perform the second programming $2^{nd}$ PGM of the first memory cell when the WAF manager 215 transmits the determined result indicating that the first data is invalid data.

In this way, the word line (e.g., the first word line WL1) connected to the first memory cell MC1 may be prevented from being unnecessarily programmed.

The operation of the storage device 200 including the WAF manager 215 described above will be described with reference to a flowchart.

Figure 6:
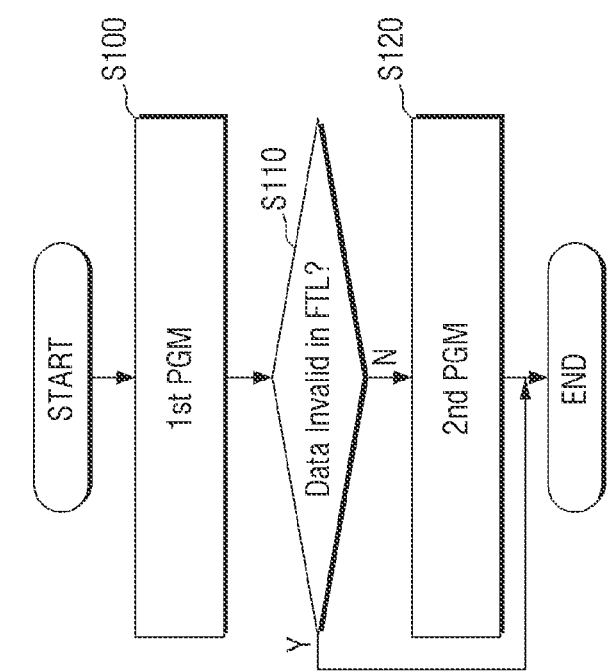
FIG. 6 is a flowchart for describing the operation of the WAF manager of FIG. 5 according to some embodiments.

FIG. 6 is a flowchart for describing the operation of the WAF manager of FIG. 5 according to some embodiments.

Referring to FIGS. 1, 3, 5, and 6, the first programming $1^{st}$ PGM is performed to write the first data to the first memory cell MC1 in S100.

Then, the WAF manager 215 determines whether the first data is invalid data in the FTL 214 by using the FTL checker 2150 in S110.

If is determined that the first data is valid data in the FTL 214 (S110, N), the second programming $2^{nd}$ PGM of the first memory cell MC1 may be performed to write second data in S120.

Otherwise, if the first data is determined to be invalid data in the FTL 214 (S110, Y), the second programming $2^{nd}$ PGM of the first memory cell MC1 is not performed and the programming operation ends.

Figure 7:
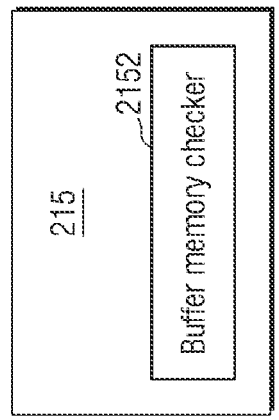
FIG. 7 is a block diagram illustrating another WAF manager according to some embodiments.

FIG. 7 is a block diagram illustrating another WAF manager according to some embodiments.

Referring to FIGS. 1, 3, and 7, the WAF manager 215 includes a buffer memory checker 2152. The buffer memory checker 2152 communicates with the buffer memory 216 to check whether the first data in the buffer memory 216 is invalid data.

For example, when it is determined that the first data in the buffer memory 216 is overwritten data, the buffer memory checker 2152 may determine that the first data is invalid data. For example, the host 100 may transfer a write command (e.g., an example of a command CMD) for the first data in the buffer memory 216 and the first data may be in a standby state in the buffer memory 216 until the first data is programmed in the NVM device. In this case, when the storage controller 210 transfers a write completion command for the first data to the host 100 and the host 100 recognizes the command and transfers a write data for the first data again, it may be determined that the first data has been overwritten.

The storage controller 210, more specifically the CPU 213 of the storage controller 210, does not perform the second programming $2^{nd}$ PGM of the first memory cell when the WAF manager 215 transmits the determined result indicating that the first data is invalid data.

In this way, the word line (e.g., the first word line WL1) connected to the first memory cell MC1 may be prevented from being unnecessarily programmed.

The operation of the storage device 200 including the WAF manager 215 described above will be described with reference to a flowchart.

Figure 8:
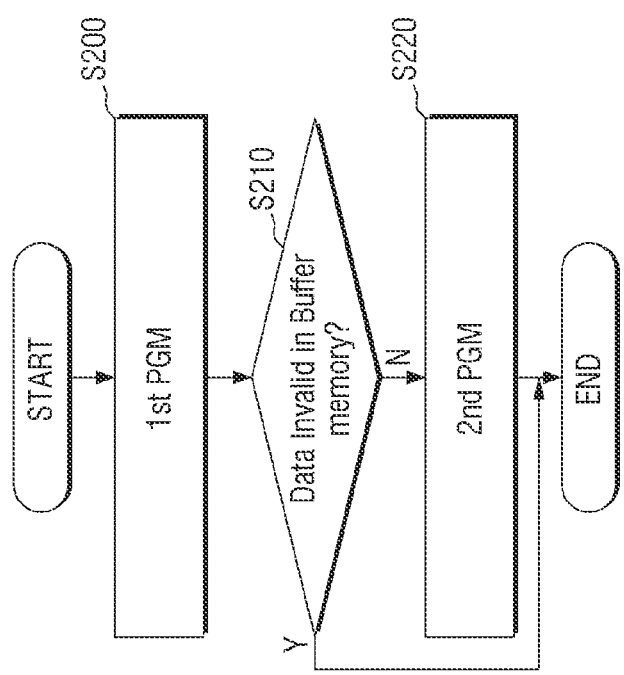
FIG. 8 is a flowchart for describing the operation of the WAF manager of FIG. 7 according to some embodiments.

FIG. 8 is a flowchart for describing the operation of the WAF manager of FIG. 7 according to some embodiments.

Referring to FIGS. 1, 3, 7, and 8, the first programming $1^{st}$ PGM is performed to write the first data to the first memory cell MC1 in S200.

Then, the WAF manager 215 determines whether the first data is invalid data in the buffer memory 216 by using the buffer memory checker 2152 in S210.

If is determined that the first data is valid data in the buffer memory 216 (S210, N), the second programming $2^{nd}$ PGM of the first memory cell MC1 may be performed to write second data in S220.

Otherwise, if the first data is determined to be invalid data in the buffer memory 216 (S210, Y), the second programming $2^{nd}$ PGM of the first memory cell MC1 is not performed and the programming operation ends.

Figure 9:
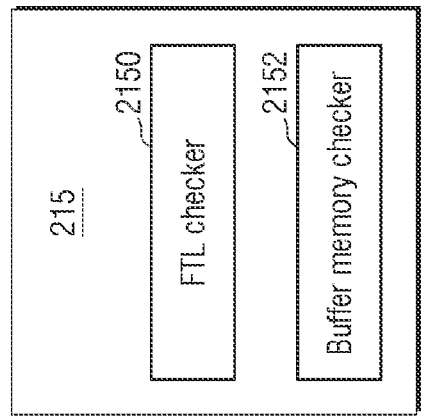
FIG. 9 is a block diagram illustrating another WAF manager according to some embodiments.

FIG. 9 is a block diagram illustrating another WAF manager according to some embodiments.

Referring to FIG. 9, the WAF manager 215 may include both the FTL checker 2150, which is described above with reference to FIGS. 5 and 6, and the buffer memory checker 2152, which is described above with reference to FIGS. 7 and 8. That is, the WAF manager 215 according to some embodiments may determine whether the first data is invalid data by using operations of the FTL checker 2150 and the buffer memory checker 2152. In some embodiments, the operations of the FTL checker 2150 and the buffer memory checker 2152 may be performed in parallel.

The operation of the WAF manager 215 according to some embodiments will be described with reference to a flowchart shown in FIG. 10.

Figure 10:
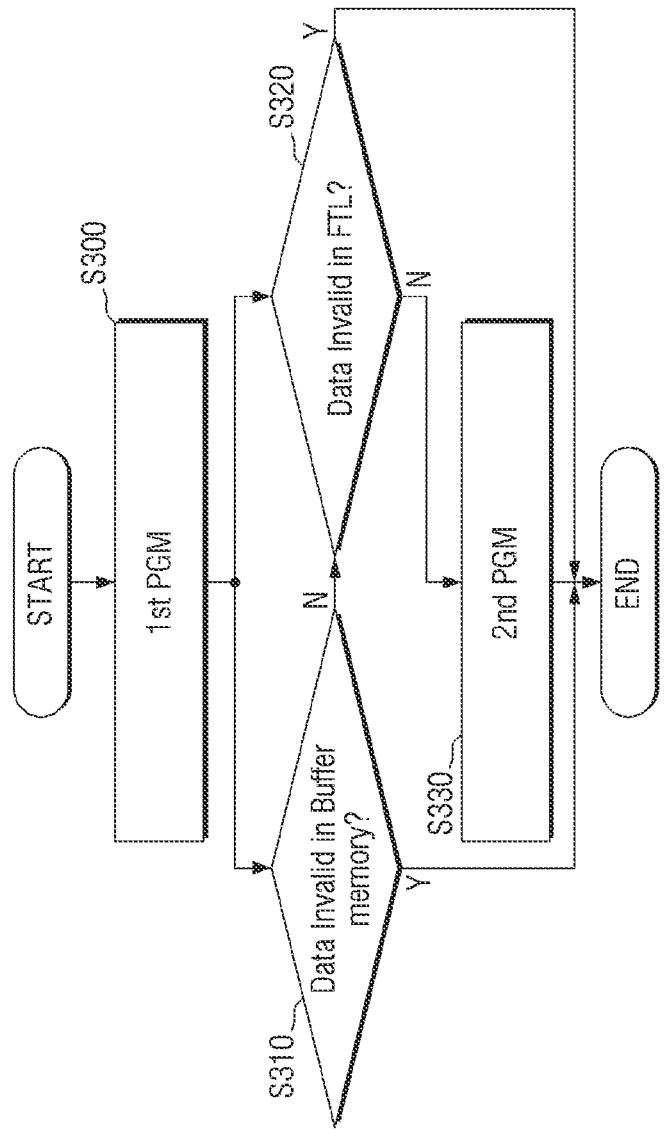
FIG. 10 is a flowchart for describing the operation of the WAF manager of FIG. 9 according to some embodiments.

FIG. 10 is a flowchart for describing the operation of the WAF manager of FIG. 9 according to some embodiments.

Referring to FIGS. 1, 3, 9, and 10, the first programming $1^{st}$ PGM is performed to write first data to the first memory cell MC1 in S300.

Thereafter, it may be determined whether the first data is invalid data in the buffer memory 216 by using the buffer memory checker 2152 in S310. Also, it may be determined whether the first data is invalid data in the FTL 214 by using the FTL checker 2150 in S320. The operation of the buffer memory checker 2152 and the operation of the FTL checker 2150 may be performed in parallel.

If the buffer memory checker 2152 determines that the first data is invalid data in the buffer memory 216 (S310, Y), the second programming $2^{nd}$ PGM of the first memory cell MC1 is not performed.

In addition, if the FTL checker 2150 determines that the first data is invalid data in the FTL 214 (S320, Y), the second programming $2^{nd}$ PGM of the first memory cell MC1 is not performed.

In other words, when the buffer memory checker 2152 determines that the first data is valid data in the buffer memory 216 (S310, N) and the FTL checker 2150 determines that the first data is valid data in the FTL 214 (S320, N), the second programming $2^{nd}$ PGM of the first memory cell MC1 may be performed. Stated another way, the second programming $2^{nd}$ PGM is only performed when the first data is valid data in both the FTL 214 and the buffer memory 216.

In this way, the word line (e.g., the first word line WL1) connected to the first memory cell MC1 may be prevented from being unnecessarily programmed.

The operation of the storage controller 210 described above with reference to FIGS. 5 to 10 according to some embodiments will be described with reference to the drawings illustrating simplified blocks.

Figure 11:
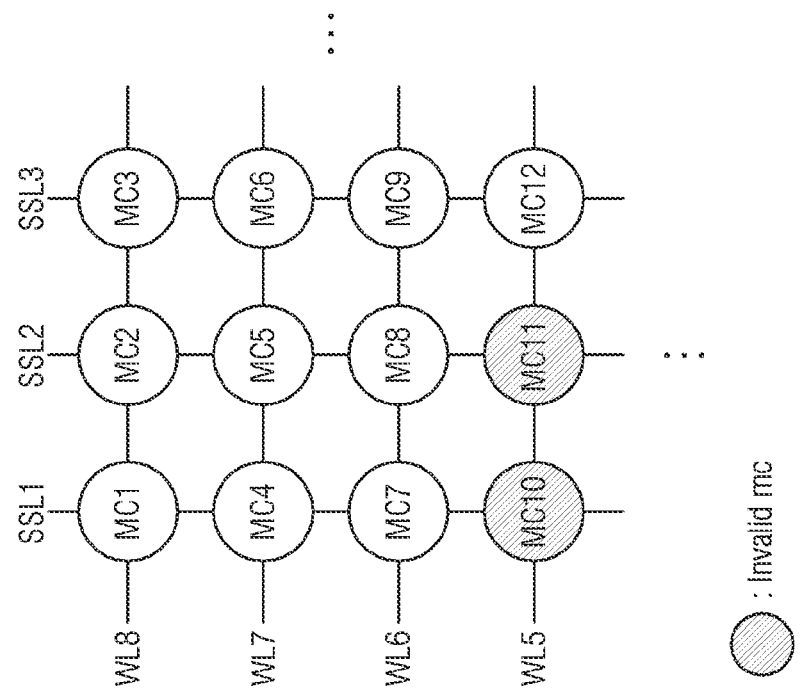
FIGS. 11 to 13 are diagrams for describing an operation of the storage controller described above with reference to FIGS. 5 to 10 according to some embodiments.
Figure 12:
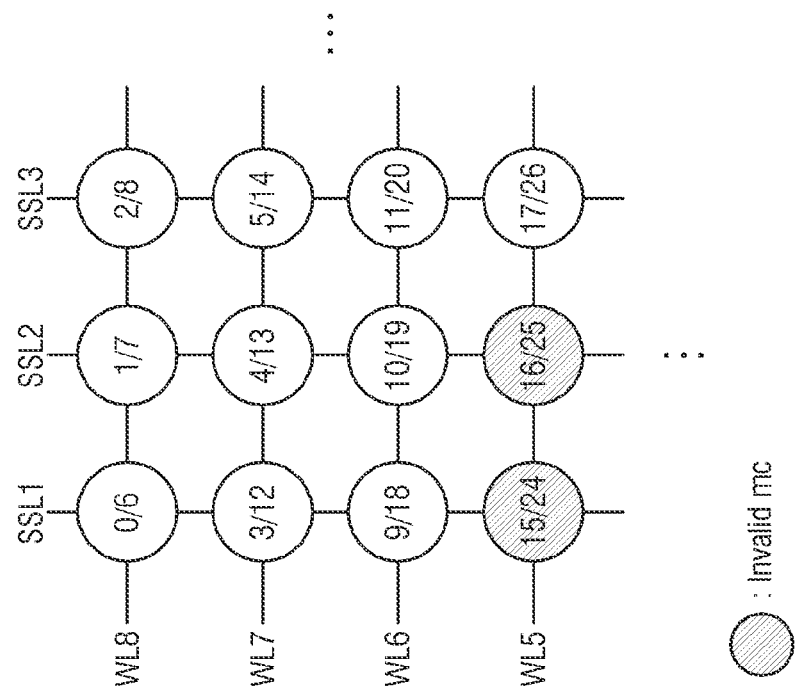
Figure 13:
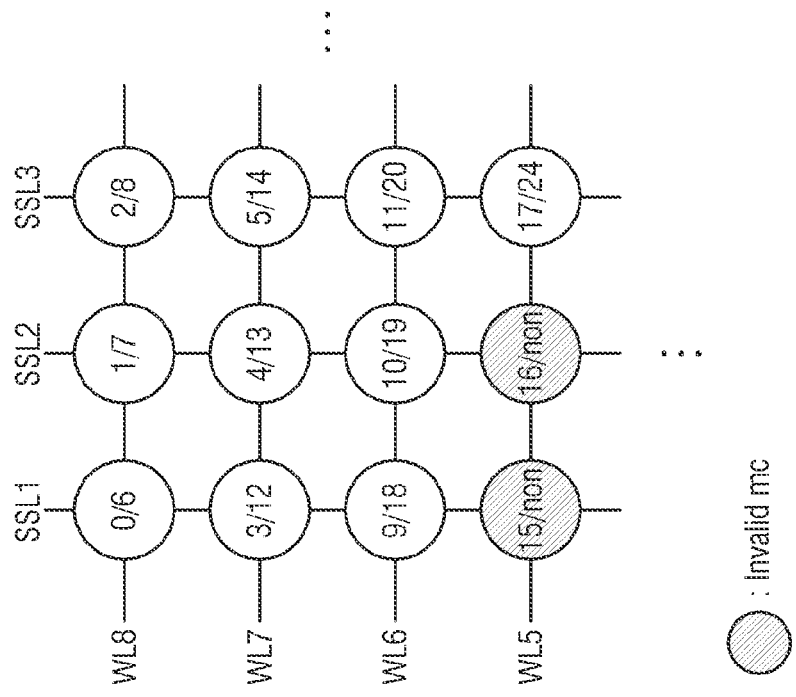

FIGS. 11 to 13 are diagrams for describing the operation of the storage controller described above with reference to FIGS. 5 to 10 according to some embodiments.

Referring to FIGS. 1, 5, 7, 9, and 11, the memory cells MC1 to MC12 may be disposed at intersections of a plurality of word lines WL5 to WL8 extending in a first direction and the plurality of string lines SSL1 to SSL3 extending in a second direction orthogonal to the first direction.

In this case, it is assumed that data to be written to a tenth memory cell MC10 and an eleventh memory cell MC11 are determined to be invalid data by the buffer memory checker 2152 and/or the FTL checker 2150. Here, the tenth memory cell MC10 and the eleventh memory cell MC11 are defined as invalid memory cells.

When the storage controller 210 writes data to the memory cells MC1 to MC12 through two times of programming, if the storage controller 210 programs all the memory cells MC1 to MC12 without checking the validity of the data before performing the second programming $2^{nd}$ PGM, the fifth word line WL5 connected to the tenth memory cell MC10 and to the eleventh memory cell MC11 may be unnecessarily programmed as shown in FIG. 12.

Referring to FIG. 12, to execute two times of programming of the memory cells MC1 to MC12 as in the related art, the first programming $1^{st}$ PGM may be sequentially performed in the order of 0 to 5 from the first memory cell MC1 to a sixth memory cell MC6. Then, the second programming $2^{nd}$ PGM may be performed in the order of 6 to 8 from the first memory cell MC1 to the third memory cell MC3. Then, the first programming $1^{st}$ PGM may be performed in the order of 9 to 11 from a seventh memory cell MC7 to a ninth memory cell MC9. Thereafter, the second programming $2^{nd}$ PGM may be performed in the order of 12 to 14 from a fourth memory cell MC4 to the sixth memory cell MC6. Then, the first programming $1^{st}$ PGM may be performed in the order of 15 to 17 from the tenth memory cell MC10 to a twelfth memory cell MC12. Then, the second programming $2^{nd}$ PGM may be performed in the order of 18 to 20 from the seventh memory cell MC7 to the ninth memory cell MC9. Since the other memory cells following the twelfth memory cell MC12 are omitted, an operation of programming in the order of 21 to 23 is not shown in FIG. 12. However, after programming is performed in the order of 21 to 23, the second programming $2^{nd}$ PGM may be performed in the order of 24 to 26 from the tenth memory cell MC10 to the twelfth memory cell MC12. That is, when the storage controller 210 writes data to the memory cells MC1 to MC12 through two times of programming, if the storage controller 210 programs all the memory cells MC1 to MC12 without checking the validity of the data before performing the second programming $2^{nd}$ PGM as in the related art, the fifth word line WL5 connected to the tenth memory cell MC10 and the eleventh memory cell MC11 may be unnecessarily programmed as shown in FIG. 12.

Therefore, as shown in FIG. 13, according to various embodiments, when the storage controller 210 writes data to the memory cells MC1 to MC12 through two times of programming, if the storage controller 210 determines the validity of the data using the WAF manager 215 before performing the second programming $2^{nd}$ PGM and thereafter performs the second programming $2^{nd}$ PGM, the fifth word line WL5 connected to the tenth memory cell MC10 and the eleventh memory cell MC11 may not be unnecessarily programmed.

Figure 14:
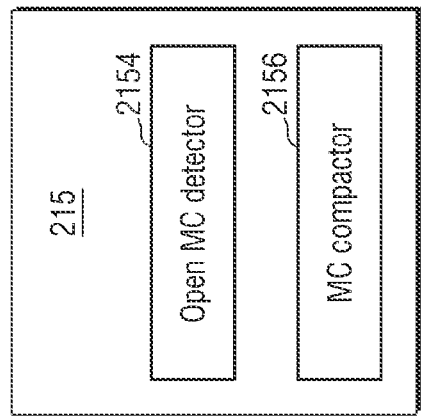
FIG. 14 is a block diagram illustrating another WAF manager according to some embodiments.

FIG. 14 is a block diagram illustrating another WAF manager according to some embodiments.

Referring to FIGS. 1 and 14, the WAF manager 215 of the storage controller 210 in accordance with some embodiments includes an open memory cell (MC) detector 2154 and a memory cell (MC) compactor 2156.

The WAF manager 215 may find a memory block which includes an open memory cell by using the open memory cell detector 2154 before performing the last programming.

For example, the open memory cell detector 2154 may check whether an open memory cell exists in a second memory block before executing the second programming $2^{nd}$ PGM to write the first data to a first memory block. The open memory cell detector 2154 may also check whether an open memory cell exists in a third memory block, etc. without being limited to the second memory block.

For example, in the first-programmed word lines among the memory blocks other than the first memory block, a location of a memory cell that has not been programmed even once before the second programming $2^{nd}$ PGM for writing the first data to the first memory block is performed may be defined as an open memory cell.

For example, if, before the second programming $2^{nd}$ PGM of a third word line located at a specific height from a string selection transistor of the first memory block, it is determined that a memory cell that has not been programmed even once is located in a third word line at the same height from a string selection transistor of the second memory block as the height of the third word line of the first memory block, the location of the memory cell may be defined as an open memory cell.

Then, before the second programming $2^{nd}$ PGM for writing the first data to the first memory block is performed, the memory cell compactor 2156 may conduct memory cell compaction by moving a memory cell which is to undergo the second programming $2^{nd}$ PGM to the location of the open memory cell.

Accordingly, the word line that is unnecessarily programmed in the first memory block may be removed.

If the first memory block also has an open memory cell, a memory cell may be moved to a memory block having a smaller number of memory cells to be moved, between the first memory block and the second memory block. That is, the memory cell which is to undergo the second programming $2^{nd}$ PGM may be moved to the memory block having fewer open memory cells, between the first memory block and the second memory block.

If an open memory cell exists in a third memory block, memory cell compaction may be conducted by moving the memory cell which is to undergo the second programming $2^{nd}$ PGM in the first memory block to the open memory cell of the third memory block.

This operation will be described with reference to FIG. 15.

Figure 15:
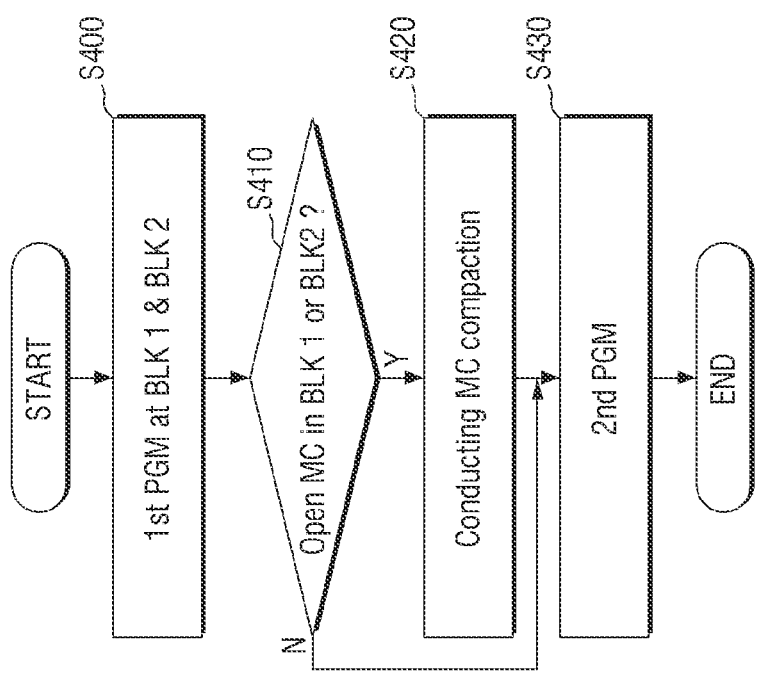
FIG. 15 is a flowchart for describing the operation of the WAF manager of FIG. 14 according to some embodiments.

FIG. 15 is a flowchart for describing the operation of the WAF manager of FIG. 14 according to some embodiments.

Referring to FIGS. 1, 14, and 15, in order to write the first data to the first memory block and write second data to the second memory block, the first programming 1$^{st}$ PGM of each of the first memory block and the second memory block is performed in S400.

Thereafter, in order to write the first data to the first memory block and write the second data to the second memory block, the open memory cell detector 2154 checks whether an open memory cell exists in the first memory block or the second memory block before the second programming 2$^{nd}$ PGM of each of the first memory block and the second memory block in S410.

If it is determined that an open memory cell does not exist in the first memory block or the second memory block (S410, N), the second programming of each of the first memory block and the second memory block is performed in S430.

Otherwise, if it is determined that an open memory cell exists in the first memory block or the second memory block (S410, Y), the memory cell compactor 2156 conducts memory cell compaction by moving a memory cell which is to undergo the second programming 2$^{nd}$ PGM to the position at which the open memory cell exists in S420.

Then, the second programming 2$^{nd}$ PGM of the first memory block and the second memory block is performed in S430.

The description made with reference to FIGS. 14 and 15 will be further described with reference to FIGS. 16 and 17 which illustrate simplified blocks.

Figure 16:
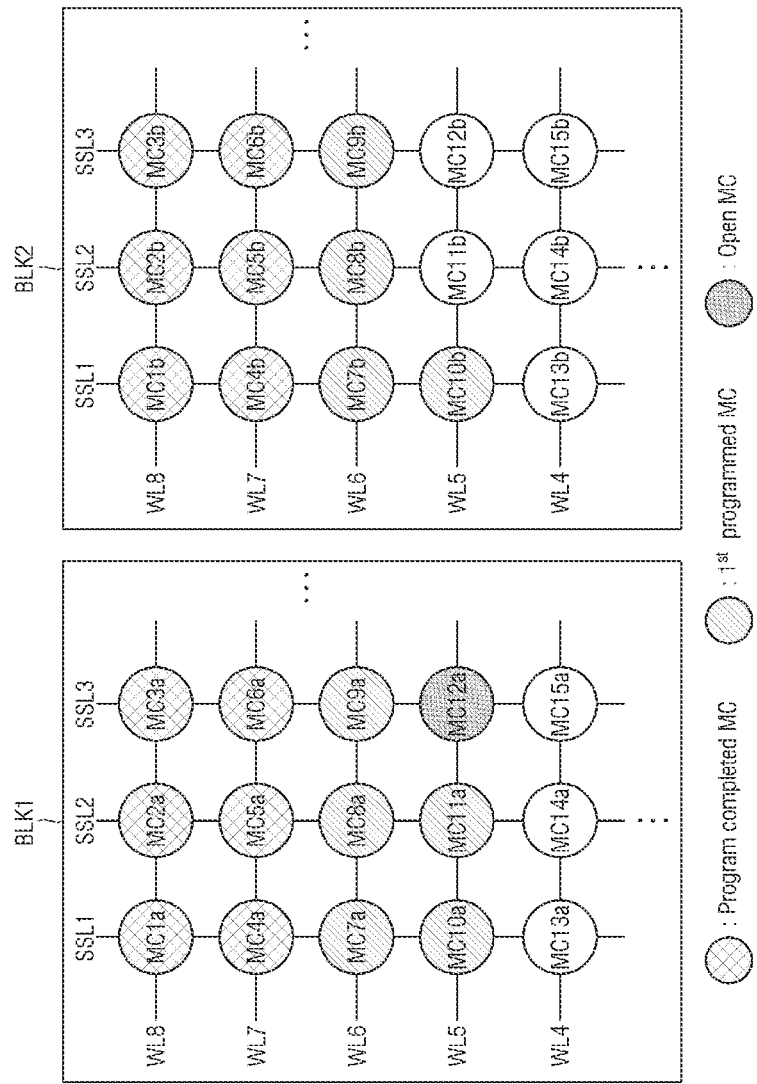
FIGS. 16 and 17 are diagrams for describing the operation of the WAF manager described above with reference to FIGS. 14 and 15 according to some embodiments.
Figure 17:
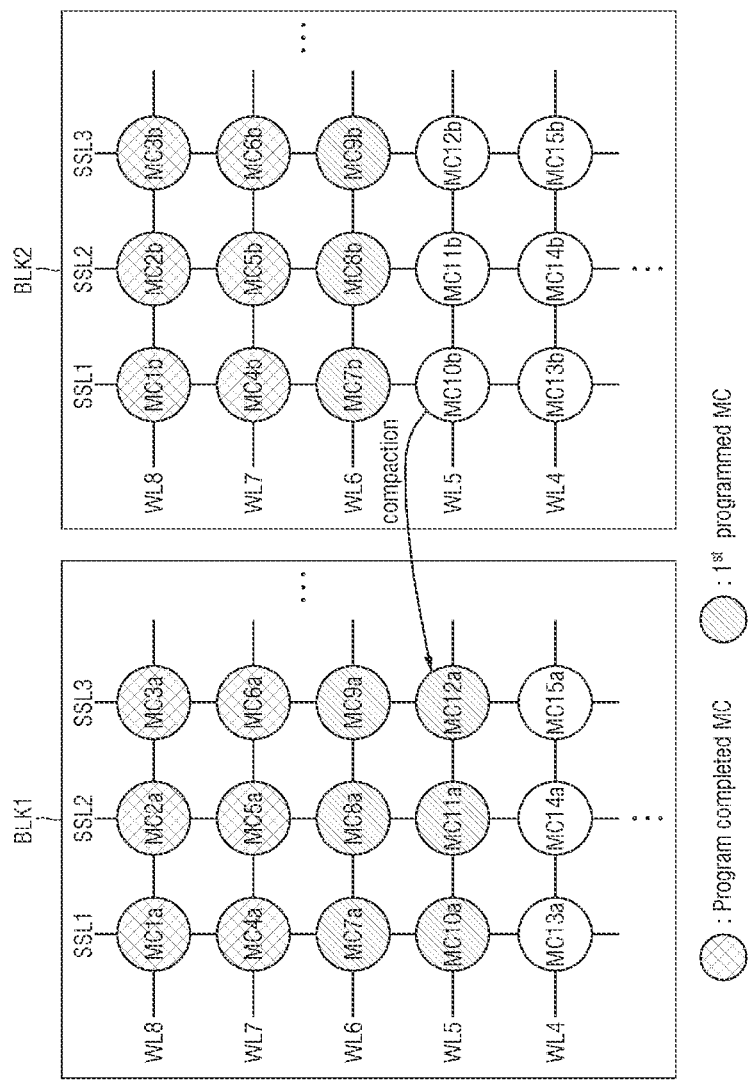

FIGS. 16 and 17 are diagrams for describing the operation of the WAF manager described above with reference to FIGS. 14 and 15 according to some embodiments.

Referring to FIGS. 1, 14, 16, and 17, an example is provided in which it may be checked whether an open memory cell exists in the first memory block BLK1 and the second memory block BLK2. However, it should be noted that it may be checked whether an open memory cell exists in any open memory cells included in the NVM device 220.

Each of the first memory block BLK1 and the second memory block BLK2 includes a fourth word line WL4 to an eighth word line WL8. Also, each of the first memory block BLK1 and the second memory block BLK2 includes the first string selection line SSL1 to the third string selection line SSL3. In each of the first memory block BLK1 and the second memory block BLK2, memory cells (memory cells MC1a to MC15a in the first memory block BLK1 and memory cells MC1b to MC15b in the second memory block BLK2) may be disposed at intersections of the fourth word line WL4 to the eighth word line WL8 and the first string selection line SSL1 to the third string selection line SSL3, similar to the example illustrated in FIG. 11.

For example, it is assumed that the memory cells MC1a to MC6a of the first memory block BLK1 and the memory cells MC1b to MC6b of the second memory block BLK2 are programmed memory cells.

Also, it is assumed that the first programming 1$^{st}$ PGM of the memory cells MC7a to MC11a is performed to write the first data to the first memory block BLK1. In this case, it is assumed that the first programming 1$^{st}$ PGM of the memory cells MC7b to MC10b is performed to write the second data to the second memory block BLK2.

That is, among the word lines WL5 and WL6 including the first-programmed memory cells in the first memory block BLK1, a word line including an unprogrammed memory cell, i.e., an open memory cell, is the fifth word line WL5 including a memory cell MC12a.

The open memory cell detector 2154 detects the memory cell 12a of the first memory block BLK1 as an open memory cell. The memory cell compactor 2156 may conduct memory cell compaction by moving a location of programming from the memory cell MC10b of the word line ML5 including the unprogrammed memory cell, among the word lines WL5 and WL6 which are to undergo the second programming 2$^{nd}$ PGM to write the second data to the first memory block BLK1, as shown in FIG. 17.

In FIG. 16, the memory cell MC12a is defined as an open memory cell, without being limited thereto. In another example, memory cells MC11b and MC12b of the second memory block BLK2 may be defined as open memory cells and compaction may be conducted by moving a location of programming from the memory cells MC10a and MC11a of the first memory block BLK1 to the locations of the memory cells MC11b and MC12b of the second memory block BLK2.

Accordingly, as shown in FIG. 17, the compaction is performed by moving a location of the first programming 1$^{st}$ PGM from the location of the memory cell MC10b in the second memory block BLK2 to the location of the open memory cell MC12a of the first memory block BLK1, so that the number of word lines to be unnecessarily programmed in the second memory block BLK2 during the second programming 2$^{nd}$ PGM may be reduced.

As a result, the WAF characteristics and the flush speed of the storage device 200 according to some embodiments may be improved.

Figure 18:
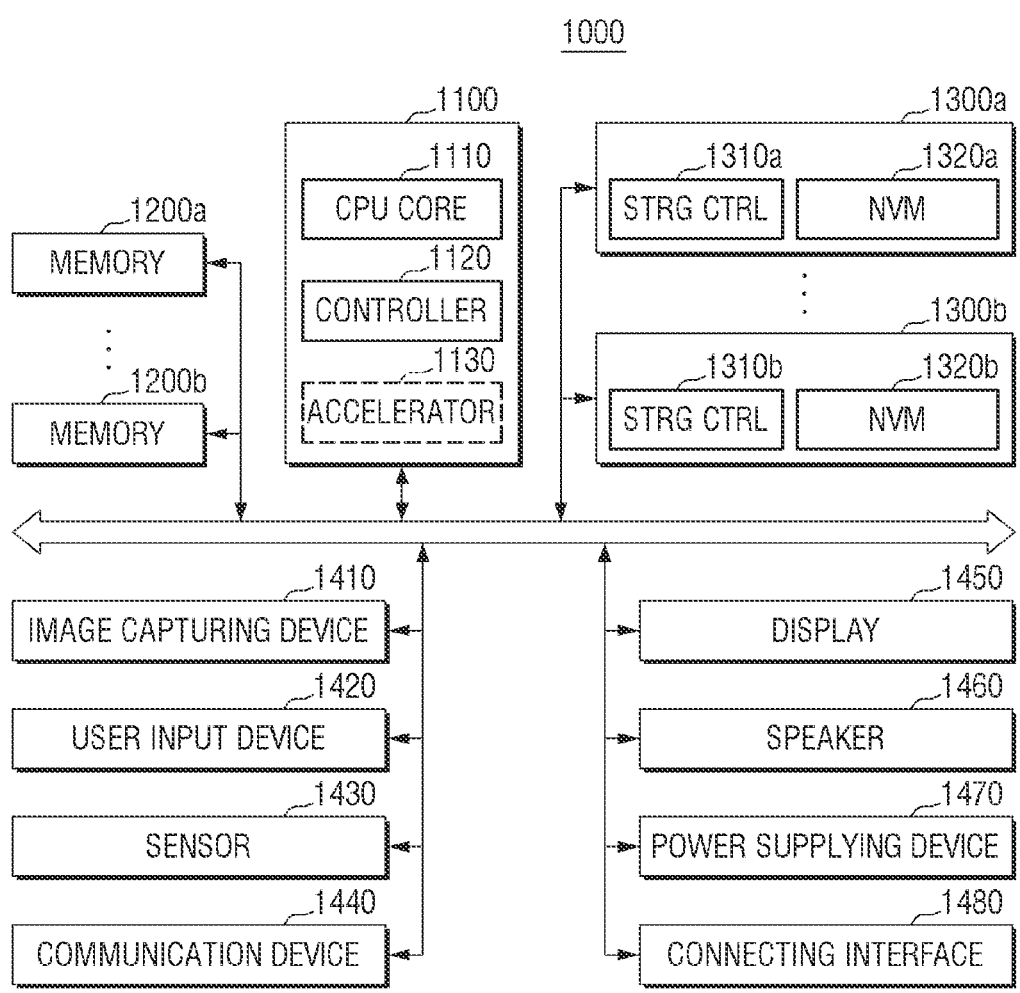
FIG. 18 is a diagram of a storage system to which a storage device is applied according to some embodiments.

FIG. 18 is a diagram of a storage system to which a storage device is applied according to some embodiments.

A storage system 1000 of FIG. 18 may be a mobile system, such as a mobile phone, a smartphone, a tablet personal computer (PC), a wearable device, a healthcare device, or an Internet-of-things (IoT) device. However, the storage system 1000 of FIG. 18 is not necessarily limited to a mobile system, and may be a PC, a laptop computer, a server, a media player, or an automotive device, such as a navigation system.

Referring to FIG. 18, the storage system 1000 may include a main processor 1100, memories 1200a and 1200b, and storage devices 1300a and 1300b, and may further include one or more of an image capturing device 1410, a user input device 1420, a sensor 1430, a communication device 1440, a display 1450, a speaker 1460, a power supplying device 1470, and a connecting interface 1480.

The main processor 1100 may control the overall operations of the storage system 1000, more specifically, operations of other components constituting the storage system 1000. The main processor 1100 may be implemented as a general-purpose processor, an exclusive processor, an application processor, or the like.

The main processor 1100 may include one or more CPU cores 1110, and may further include a controller 1120 for controlling the memories 1200a and 1200b and/or the storage devices 1300a and 1300b. According to some embodiments, the main processor 1100 may further include an accelerator 1130 which is an exclusive circuit for high-speed data computation, such as Artificial Intelligence (AI) data computation. The accelerator 1130 may include a graphics processing unit (GPU), a neural processing unit (NPU), a data processing unit (DPU), and/or the like, and may be realized as a separate chip that is physically separated from other components of the main processor 1100.

The memories 1200a and 1200b may be used as a main memory device of the storage system 1000. Although the memories 1200a and 1200b may include volatile memories, such as static RAM (SRAM), DRAM, and/or the like, the memories 1020a and 1020b may include non-volatile memories, such as flash memory, phase RAM (PRAM), resistive RAM (RRAM), and/or the like. The memories 1200a and 1200b may be embodied in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers 1310a and 1310b and NVMs 1320a and 1320b configured to store data under the control of the storage controllers 1310a and 1310b. Although the NVMs 1320a and 1320b may include V-NAND flash memories having a 2D structure or a 3D structure, the NVMs 1320a and 1320b may include other types of NVMs, such as PRAM and/or RRAM.

The storage devices 1300a and 1300b may be physically separated from the main processor 1100 and included in the storage system 1000 or embodied in the same package as the main processor 1100. In addition, the storage devices 1300a and 1300b may have types of memory cards and be removably combined with other components of the storage system 1000 through an interface, such as the connecting interface 1480 that will be described below. The storage devices 1300a and 1300b may be devices to which a standard protocol, such as a universal flash storage (UFS), is applied, without being limited thereto.

At least one of the storage devices 1300a and 1300b may be the storage device 200 described above with reference to FIGS. 1 to 17.

The optical input device 1410 may capture still images or moving images. The optical input device 1410 may include a camera, a camcorder, a webcam, and/or the like.

The user input device 1420 may receive various types of data input by a user of the storage system 1000 and include a touch pad, a keypad, a keyboard, a mouse, and/or a microphone.

The sensor 1430 may detect various types of physical quantities, which may be obtained from the outside of the storage system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transfer and receive signals between other devices outside the storage system 1000 according to various communication protocols. The communication device 1440 may include an antenna, a transceiver, and/or a modem.

The display 1450 and the speaker 1460 may serve as output devices configured to respectively output visual information and auditory information to the user of the storage system 1000.

The power supplying device 1470 may appropriately convert power supplied from a battery (not shown) embedded in the storage system 1000 and/or an external power source, and supply the converted power to each of components of the storage system 1000.

The connecting interface 1480 may provide connection between the storage system 1000 and an external device, which is connected to the storage system 1000 and capable of transferring and receiving data to and from the storage system 1000. The connecting interface 1480 may be embodied by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 19:
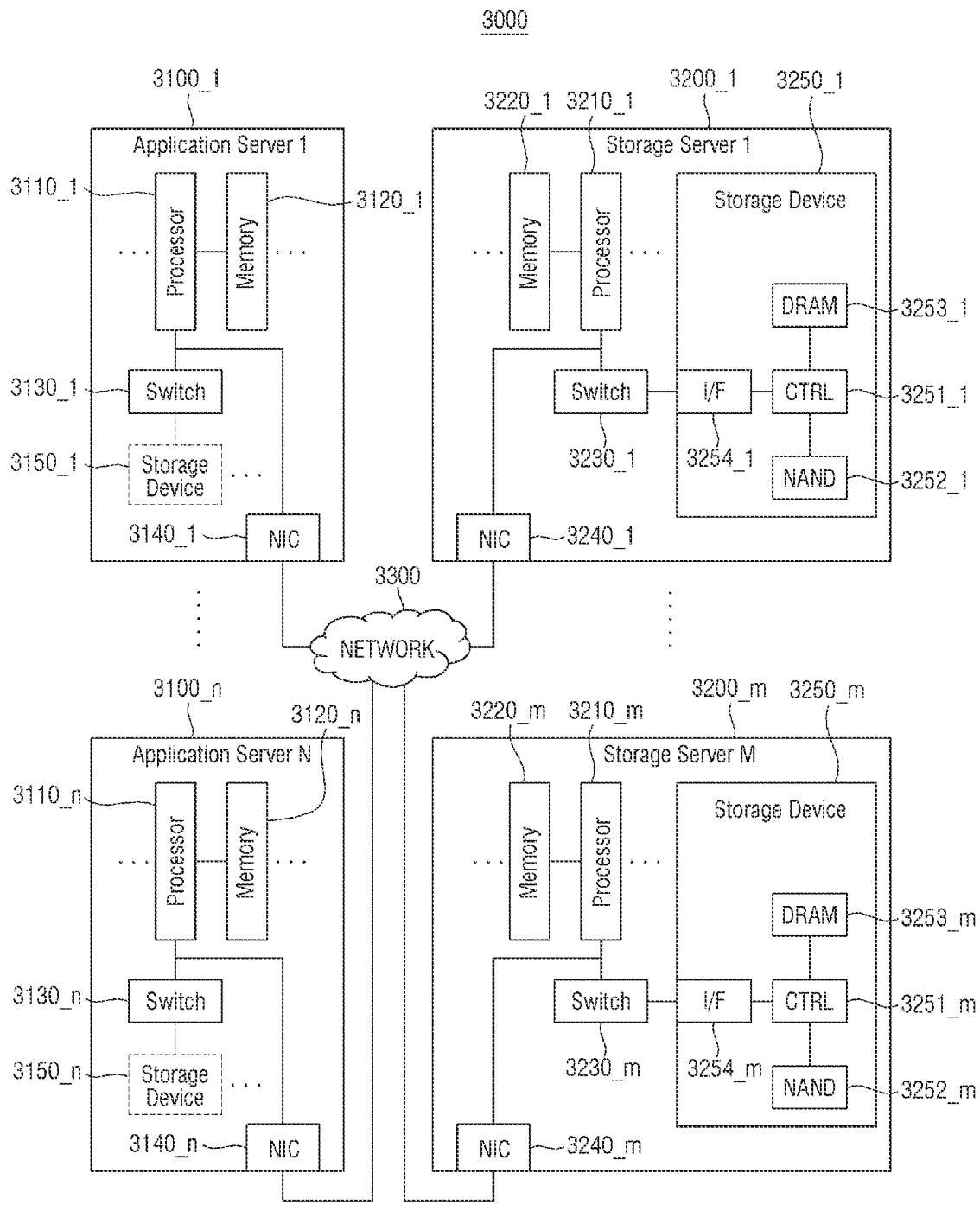
FIG. 19 is a diagram of a data center to which a storage device is applied according to some embodiments.

FIG. 19 is a diagram of a data center to which a storage device is applied according to some embodiments.

Referring to FIG. 19, a data center 3000 may be a facility that collects various types of data and provides various services, and may be referred to as a data storage center. The data center 3000 may be a system for operating search engines and databases and may be a computing system used by companies, such as banks or government agencies. The data center 3000 may include application servers 3100_1 to 3100_n and storage servers 3200_1 to 3200_m. The number of the application servers 3100_1 to 3100_n and the number of the storage servers 3200_1 to 3200_m may be variously selected according to embodiments. The number of the application servers 3100_1 to 3100_n and the number of the storage servers 3200_1 to 3200_m may be different from each other.

The application server 3100_1 may include at least one processor 3110_1 and at least one memory 3120_1, and the storage server 3200_1 may include at least one processor 3210_1 and at least one memory 3220_1. An operation of the storage server 3200_1 will be described as an example. The processor 3210_1 may control overall operations of the storage server 3200_1, and may access the memory 3220_1 to execute instructions and/or data loaded in the memory 3220_1. The memory 3220 may include at least one of a double data rate (DDR) synchronous dynamic random access memory (SDRAM), a high bandwidth memory (HBM), a hybrid memory cube (HMC), a dual in-line memory module (DIMM), an Optane DIMM, and/or a non-volatile DIMM (NVDIMM). The number of the processors 3210_1 and the number of the memories 3220_1 included in the storage server 3200_1 may be variously selected according to embodiments. In one embodiment, the processor 3210_1 and the memory 3220_1 may provide a processor-memory pair. In one embodiment, the number of the processors 3210_1 and the number of the memories 3220_1 may be different from each other. The processor 3210_1 may include a single core processor or a multiple core processor. The above description of the storage server 3200_1 may be similarly applied to the application server 3100_1. In some embodiments, the application server 3100_1 may not include the storage device 3150_1. The storage server 3200_1 may include at least one storage device 3250_1. The number of the at least one storage device 3250_1 included in the storage server 3200_1 may be variously selected according to example embodiments.

The application servers 3100_1 to 3100_n and the storage servers 3200_1 to 3200_m may communicate with each other through a network 3300. The network 3300 may be implemented using a fiber channel (FC) or an Ethernet. In this case, the FC may be a medium used for a relatively high speed data transmission, and an optical switch that provides high performance and/or high availability may be used. The storage servers 3200_1 to 3200_m may be provided as file storages, block storages, or object storages according to an access scheme of the network 3300.

In some embodiments, the network 3300 may be a storage-only network or a network dedicated to a storage, such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In another example, the network 3300 may be a general or normal network such as the TCP/IP network. For example, the network 3300 may be implemented according to at least one of protocols, such as an FC over Ethernet (FCoE), a network attached storage (NAS), a non-volatile memory express (NVMe) over Fabrics (NVMe-oF), etc.

Hereinafter, a description will be given focusing on the application server 3100_1 and the storage server 3200_1. The description of the application server 3100_1 may be applied to the other application servers 3100_2 to 3100_n, and the description of the storage server 3200_1 may be applied to the other storage servers 3200_2 to 3200_m, and thus repeated description thereof is omitted for conciseness.

The application server 3100_1 may store data requested to be stored by a user or a client into one of the storage servers 3200_1 to 3200_m through the network 3300. In addition, the application server 3100 may obtain data requested to be read by the user or the client from one of the storage servers 3200_1 to 3200_m through the network 3300. For example, the application server 3100_1 may be implemented as a web server or a database management system (DBMS).

The application server 3100_1 may access a memory 3120_n or a storage device 3150_n included in the other application server 3100_n through the network 3300, and/or may access the memories 3220_1 to 3220_m or the storage devices 3250 to 3250m included in the storage servers 3200_1 to 3200_m through the network 3300. Therefore, the application server 3100 may perform various operations on data stored in the application servers 3100_1 to 3100_n and/or the storage servers 3200_1 to 3200_m. For example, the application server 3100_1 may execute a command for moving or copying data between the application servers 3100_1 to 3100_n and/or the storage servers 3200_1 to 3200_m. The data may be transferred from the storage devices 3250_1 to 3250_m of the storage servers 3200_1 to 3200_m to the memories 3120_1 to 3120_n of the application servers 3100 to 3100n directly or through the memories 3220_1 to 3220_m of the storage servers 3200_1 to 3200_m. For example, the data transferred through the network 3300 may be encrypted data for security or privacy.

In the storage server 3200_1, an interface 3254_1 may provide a physical connection between the processor 3210_1 and a controller 3251_1 and/or a physical connection between a network interface card (NIC) 3240_1 and the controller 3251_1. For example, the interface 3254_1 may be implemented based on a direct attached storage (DAS) scheme in which the at least one storage device 3250_1 is directly connected with a dedicated cable. For example, the interface 3254_1 may be implemented based on at least one of various interface schemes, such as an advanced technology attachment (ATA), a serial ATA (SATA), an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 3200_1 may further include a switch 3230_1 and the NIC 3240_1. The switch 3230_1 may selectively connect the processor 3210_1 with the storage device 3250_1 or may selectively connect the NIC 3240_1 with the storage device 3250_1 under the control of the processor 3210_1.

In some embodiments, the NIC 3240_1 may include a network interface card, a network adapter, or the like. The NIC 3240_1 may be connected to the network 3300 through a wired interface, a wireless interface, a Bluetooth interface, an optical interface, or the like. The NIC 3240_1 may further include an internal memory, a digital signal processor (DSP), a host bus interface, or the like, and may be connected to the processor 3210_1 and/or the switch 3230_1 through the host bus interface. The host bus interface may be implemented as one of the above-described examples of the interface 3254_1. In one embodiment, the NIC 3240_1 may be integrated with at least one of the processor 3210_1, the switch 3230_1, and the storage device 3250_1.

In the storage servers 3200_1 to 3200_m and/or the application servers 3100_1 to 3100_n, the processor may transmit a command to the storage devices 3150_1 to 3150_n and 3250_1 to 3250_m or the memories 3120_1 to 3120_n and 3220_1 to 3220_m to program or read data. At this time, the data may be error-corrected data by an ECC engine. For example, the data may be processed by a data bus inversion (DBI) or a data masking (DM), and may include a cyclic redundancy code (CRC) information. For example, the data may be encrypted data for security or privacy.

The storage devices 3150_1 to 3150_m and 3250_1 to 3250_m may transmit a control signal and command/address signals to NAND flash memory devices 3252_1 to 3252_m in response to a read command received from the processor. When data is read from the NAND flash memory devices 3252_1 to 3252_m, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 3251_1 may control the overall operations of the storage device 3250_1. In one embodiment, the controller 3251_1 may include a static random access memory (SRAM). The controller 3251_1 may write data to the NAND flash memory device 3252_1 in response to a write command, or may read data from the NAND flash memory device 3252_1 in response to a read command. For example, the write command and/or the read command may be provided from the processor 3210_1 in the storage server 3200_1, the processor 3210_m in the other storage server 3200_m, or the processors 3110_1 and 3110_n in the application servers 3100_1 and 3100_n. A DRAM 3253_1 may temporarily store (e.g., may buffer) data to be written to the NAND flash memory device 3252_1 or data read from the NAND flash memory device 3252_1. Further, the DRAM 3253_1 may store metadata. The metadata may be data generated by the controller 3251_1 to manage user data or the NAND flash memory device 3252_1. The storage device 3250_1 may include a secure element for security or privacy.

The controller 3251_1 may be the storage controller 210 described above with reference to FIGS. 1 to 17, and the storage device 3250_1 may be the storage device 200 described with reference to FIGS. 1 to 17.

While various embodiments have been described above with reference to the drawings, it will be apparent to those of ordinary skill in the art that various changes and modifications may be made thereto without departing from the spirit and scope of the present disclosure as set forth in the following claims.

What is claimed:

1. A storage controller for writing first data to a first memory cell by performing programming of the first memory cell N-times (N being a positive integer greater than 1), the storage controller comprising:
    a write amplification (WAF) manager configured to check whether the first data is invalid data before an $N^{th}$ programming of the first memory cell is performed; and
    a central processing unit (CPU) configured not to perform the N-th programming of the first memory cell when the first data is the invalid data.

2. The storage controller of claim 1, further comprising a buffer memory configured to store the first data,
    wherein the WAF manager comprises a buffer memory checker configured to communicate with the buffer memory and check whether the first data stored in the buffer memory is the invalid data.

3. The storage controller of claim 1, further comprising a flash translation layer (FTL) configured to perform address mapping by using a mapping table which stores mapping information between a first logical address of the first data and a first physical address of the first data,
    wherein the WAF manager comprises an FTL checker configured to communicate with the FTL and check whether the first data in the mapping table is the invalid data.

4. The storage controller of claim 1, wherein, when the first data is trimmed data, the first data is the invalid data.

5. The storage controller of claim 1, wherein, when the first data is not mapped in a mapping table, the first data is the invalid data.

6. The storage controller of claim 1, wherein second data is written to a second memory cell connected to a same word line as the first memory cell by performing programming of the second memory cell N-times, and
    wherein, when the first data is the invalid data, the $N^{th}$ programming of the first memory cell is not performed and the $N^{th}$ programming of the second memory cell is performed to write the second data.

7. The storage controller of claim 6, wherein the storage controller performs programming of a third memory cell N-times, the third memory cell being connected to the same word line as the first memory cell and the second memory cell.

8. A storage device for writing first data to a first memory cell by performing programming of the first memory cell N-times (N being a positive integer greater than 1), the storage device comprising:
    a non-volatile memory (NVM) device comprising the first memory cell; and
    a storage controller configured to write the first data to the first memory cell,
    wherein the storage controller comprises:
    a write amplification (WAF) manager configured to check whether the first data is invalid data before an $N^{th}$ programming of the first memory cell is performed; and
    a central processing unit (CPU) configured not to perform the N-th programming of the first memory cell when the first data is the invalid data.

9. The storage device of claim 8, wherein the storage controller further comprises a buffer memory configured to store the first data, and
    wherein the WAF manager comprises a buffer memory checker configured to communication with the buffer memory and check whether the first data stored in the buffer memory is the invalid data.

10. The storage device of claim 8, wherein the storage controller further comprises a flash translation layer (FTL) configured to perform address mapping by using a mapping table which stores mapping information between a first logical address of the first data and a first physical address of the first data, and
    wherein the WAF manager comprises an FTL checker configured to communicate with the FTL and check whether the first data in the mapping table is the invalid data.

11. The storage device of claim 8, wherein, when the first data is trimmed data, the first data is the invalid data.

12. The storage device of claim 8, wherein, when the first data is not mapped in a mapping table, the first data is the invalid data.

13. The storage device of claim 8, wherein second data is written to a second memory cell connected to a same word line as the first memory cell by performing programming of the second memory cell N-times, and
    wherein, when the first data is the invalid data, the $N^{th}$ programming of the first memory cell is not performed and the $N^{th}$ programming of the second memory cell is performed to write the second data.

14. The storage device of claim 13, wherein the storage controller performs programming of a third memory cell N-times, the third memory cell being connected to the same word line as the first memory cell and the second memory cell.

15. A storage device for writing first data to a first memory block and writing second data to a second memory block by performing programming of each of the first memory block and the second memory block N-times (N being a positive integer greater than 1), the storage device comprising:
    a non-volatile memory (NVM) device comprising the first memory block and the second memory block; and
    a storage controller configured to write the first data to the first memory block and write the second data to the second memory block,
    wherein the storage controller comprises:
    a write amplification (WAF) manager comprising an open memory cell detector configured to check whether an open memory cell exists in the first memory block or the second memory block before an $N^{th}$ programming of the first memory block and the second memory block is performed, and a memory cell compactor configured to conduct memory cell compaction by moving a location of an $(N-1)^{th}$-programming of a memory cell in one memory block of the first memory block and the second memory block to a memory cell in the other memory block of the first memory block and the second memory block when the open memory cell exists in the first memory block or the second memory block; and
    a central processing unit (CPU) configured to not perform the $N^{th}$ programming of the first memory block and the second memory block after the memory cell compactor conducts the memory cell compaction.

16. The storage device of claim 15, wherein the memory cell compaction is conducted by moving the location of the $(N-1)^{th}$-programming of the memory cell to a memory block having fewer open memory cells.

17. The storage device of claim 16, wherein the memory cell whose $(N-1)^{th}$-programming location is moved is a memory cell existing on a word line of a same order in the first memory block and the second memory block.

18. The storage device of claim 15, wherein the open memory cell is an empty memory cell of a last word line that is $(N-1)^{th}$ programmed in the first memory block or the second memory block.

19. The storage device of claim 18, wherein, when the open memory cell does not exist, the memory cell compaction is not conducted.

20. The storage device of claim 15, wherein the NVM device further comprises a third memory block and the storage controller writes third data to the third memory block by performing programming of the third memory block N-times, and
- wherein the open memory cell detector is configured to detect the open memory cell existing in the first memory block and the second memory block before the storage controller performs an $N^{th}$ programming of the third memory block.

\* \* \* \* \*